United States Patent [19]

Park et al.

[11] 4,385,938

[45] May 31, 1983

[54] DUAL SPECIES ION IMPLANTATION INTO GAAS

[75] Inventors: Yoon S. Park, Kettering; Yung K. Yeo, Dayton, both of Ohio

[73] Assignee: The United States of America as represented by the Secretary of the Air Force, Washington, D.C.

[21] Appl. No.: 300,839

[22] Filed: Sep. 10, 1981

[51] Int. Cl.³ .......................................... H01L 21/263
[52] U.S. Cl. .................................. 148/1.5; 29/576 B; 29/576 E; 148/187; 357/61; 357/91
[58] Field of Search ................... 148/1.5, 187; 357/91, 357/61; 29/576 E, 576 B

[56] References Cited

PUBLICATIONS

Pedroti et al., J. Appl. Phys. 51, (Nov. 1980) 5781.
Yeo et al., J. Appl. Phys. 51, (Nov. 1980) 5785.
Stoneham et al., Jour. Electronic Materials, 9 (1980) 371.
Stollte, C.A., in Ion Implantation in Semi-Conductors, 1976, ed. Chernow et al., Plenum, N.Y., p. 149.
Weyer et al., Phys. Rev. Letts. 44, (1980) 155.
Brozel et al., Jour. Crystal Growth, 50 (1980) 619.
Vaidyanathan et al., J. Electrochem. Soc. 124, (1977) 1781.

*Primary Examiner*—Upendra Roy
*Attorney, Agent, or Firm*—Donald J. Singer; Bernard E. Franz

[57] ABSTRACT p- and n- layers in GaAs by dual implants with either Ge and Ga or Ge and As into GaAs have been produced. The amphoteric behavior of Ge implants is modified in a predictable manner through control of ion dose and annealing temperature by dual implantation. The (Ge+Ga) dual implants have produced p-type conductivity for all doses up to an anneal temperature of 900° C. The (Ge+As) dual implants have yielded a significant enhancement of the n-type activity for ion doses $\geq 1 \times 10^{15}/cm^2$, a conductivity type conversion for intermediate doses and little effect upon p-type activity for ion doses $\leq 3 \times 10^{13}/cm^2$. By selecting appropriate ion energy, ion dose, and annealing temperature, formation of p-n junction is envisioned.

10 Claims, 12 Drawing Figures

PREPARE SURFACE　　　　　　　a. Lap & Polish
　　　　　　　　　　　　　　　　b. Chemical Etch
*Fig. 10*
S. I. Ga As
Semi-insulating
DUAL IMPLANT AND ANNEAL
400 keV, Ge⁺ and Ga⁺, $3 \times 10^{13}/cm^2$
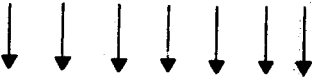
*Fig. 11*
S. I. Ga As
DUAL IMPLANT AND ANNEAL
100 keV, Ge⁺ and As⁺, $1 \times 10^{15}/cm^2$
*Fig. 12*
Ion Implanted (Ge + Ga) p-Layer
S. I. GaAs 4,385,938

DUAL SPECIES ION IMPLANTATION INTO GAAS

RIGHTS OF THE GOVERNMENT

The invention described herein may be manufactured and used by or for the Government of the United States for all governmental purposes without the payment of any royalty.

BACKGROUND OF THE INVENTION

This invention relates to dual species ion implantation into gallium arsenide, and more particularly to a method of producing p- and n-type layers in GaAs by dual implantation of (Ge+Ga) or (Ge+As).

The concept of dual implantation, as proposed by Heckingbottom and Ambridge has been tested by several workers to improve the electrical activity and inhibit the diffusion of certain implant species. This approach is based on the maintenance of stoichiometry in the host lattice in order to avoid compensation due to vacancy complexes with the dopant. In the case of amphoteric (defined as producing either n- or p-type) dopants, dual implantation permits shifting the probability of lattice site occupancy by the dopant to favor either n- or p-type activity. By control and shift of defect stoichiometry of GaAs precise control of the behavior of the dopants can be attained.

Some degree of success has been achieved in the production of high carrier concentrations by dual implantation. For example, in comparison with Se single implants into GaAs, donor activity enhanced by the implantation of an equal dose of Ga has been reported. The improvement of p-type activity has been observed as a result of the dual implantation of C and Ga into GaAs. Dual implants of Zn or Cd and As into GaAs have been found to decrease considerably the diffusion of the implanted Zn or Cd.

Germanium has been used as a dopant in GaAs. An understanding of the physics involved in the behavior of Ge implants is particularly important in applications where the amphoteric nature of the dopant is used to advantage. Ge has been widely used as a dopant in epitaxial layers of GaAs because of its low diffusivity. Ge has also been utilized to produce stable, reliable and reproducible ohmic contacts to n-type GaAs by methods which achieve high densities of Ge almost exclusively on Ga lattice sites. More recently, the feasibility of fabricating p/n junctions and p/n multilayers using Ge dopants in GaAs by molecular beam epitaxy has been demonstrated.

The single implants of Ge in GaAs have shown amphoteric behavior, where the conductivity type, electrical activity, and carrier mobility depend critically upon ion dose and annealing temperature. Low doses of the Ge implant appear to favor substitution into As sites, resulting in p-type activity, while high doses shown n-type activity due to preferential occupation of Ga sites by the Ge ions. These results are reported in a paper by Y. K. Yeo et al on "Amphoteric Behavior of Ge Implants in GaAs", Applied Physics Letters, Vol. 35, No. 2, pages 197–199, July 15, 1979 (American Institute of Physics).

Dual implantation is described in U.S. Pat. No. 4,137,103 by Mader et al. for "Silicon Integrated Circuit Region Containing Implanted Arsenic and Germanium". Dual implantations into GaAs which involve Ga and As ions is also disclosed by E. B. Stoneham et al, "Formation of Heavily Doped N-type Layers in GaAs by Multiple Ion Implantation", Journal of Electronic Materials, Vol. 9, No. 2, 1980, pages 371–383. The concept that Ga implants produce donors via As vacancies and that As implants produce acceptors via Ga vacancies is shown by Stolte, "Dual Species Ion Implantation into GaAs" at pages 149–157 from "Ion Implantation of Semiconductors" 1976 by Chernow, Borders, and Brice. Also from the same book at pages 585–592 is an article by M. Takai et al on "Effects of Dual Implantations and Annealing Atmosphere on Lattice Locations and Atom Profiles of Sn and Sb Implanted in GaP".

Though the experiments reported in the above references have proved the effectiveness of dual implantation in maintaining the stoichiometry in the host lattice in a broad sense, they have not investigated systematically experimental parameters such as annealing temperature and fluence to attain high electrical activity on p- and n-layers.

SUMMARY OF THE INVENTION

The object of this invention is to provide a method of dual implantation with Ge and Ga or As into GaAs to provide low sheet conductivity and good mobility layers, good integrity of dopant profiles, good ohmic contacts, control of diffusion and enhancement of conductivity, and establishing post-implantation annealing conditions following ion implantation such as temperature, duration and encapsulants.

According to the invention, p- and n-layers in GaAs by dual implants with either Ge and Ga or Ge and As have been produced. The amphoteric behavior of Ge implants is modified in a controlled manner through control of ion dose (fluence) in the range of $10^{13}$ to $10^{15}/cm^2$ and annealing temperature in the range of 700° to 950° C. The (Ge+Ga) dual implants have produced p-type conductivity for all doses up to an anneal temperature of 900° C. The (Ge+As) dual implants have yielded a significant enhancement of the n-type activity for ion doses greater or equal to $1 \times 10^{15}/cm^2$, a conductivity type conversion for intermediate doses and little effect upon p-type activity for ion doses less than or equal to $3 \times 10^{13}/cm^2$. By selecting appropriate ion energy, ion dose, and annealing temperature, p-n junctions may be formed.

BRIEF DESCRIPTION OF THE DRAWING

FIGS. 10–12 are diagrams showing steps of p-n junction formation by dual implantation.

DETAILED DESCRIPTION

Figure 1:
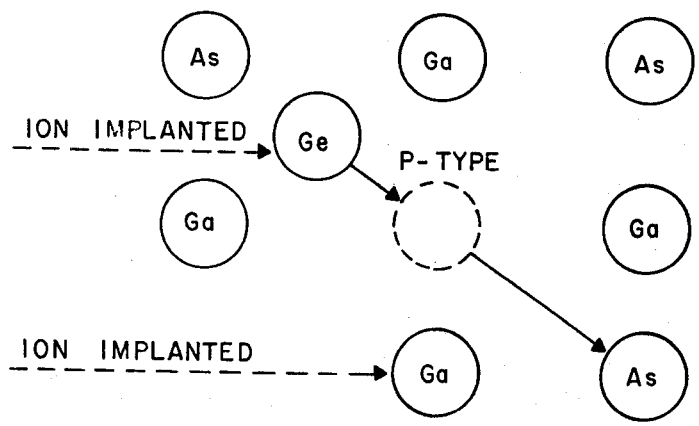
FIGS. 1 and 2 are diagrams showing the GaAs lattice and dual ion implantation.
Figure 2:
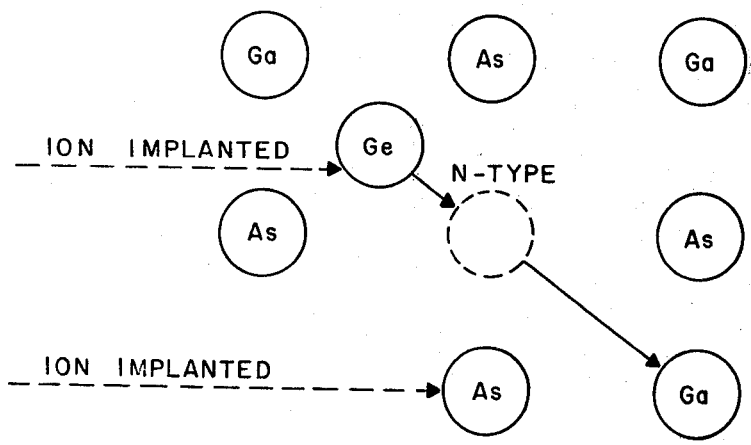
Figure 3:
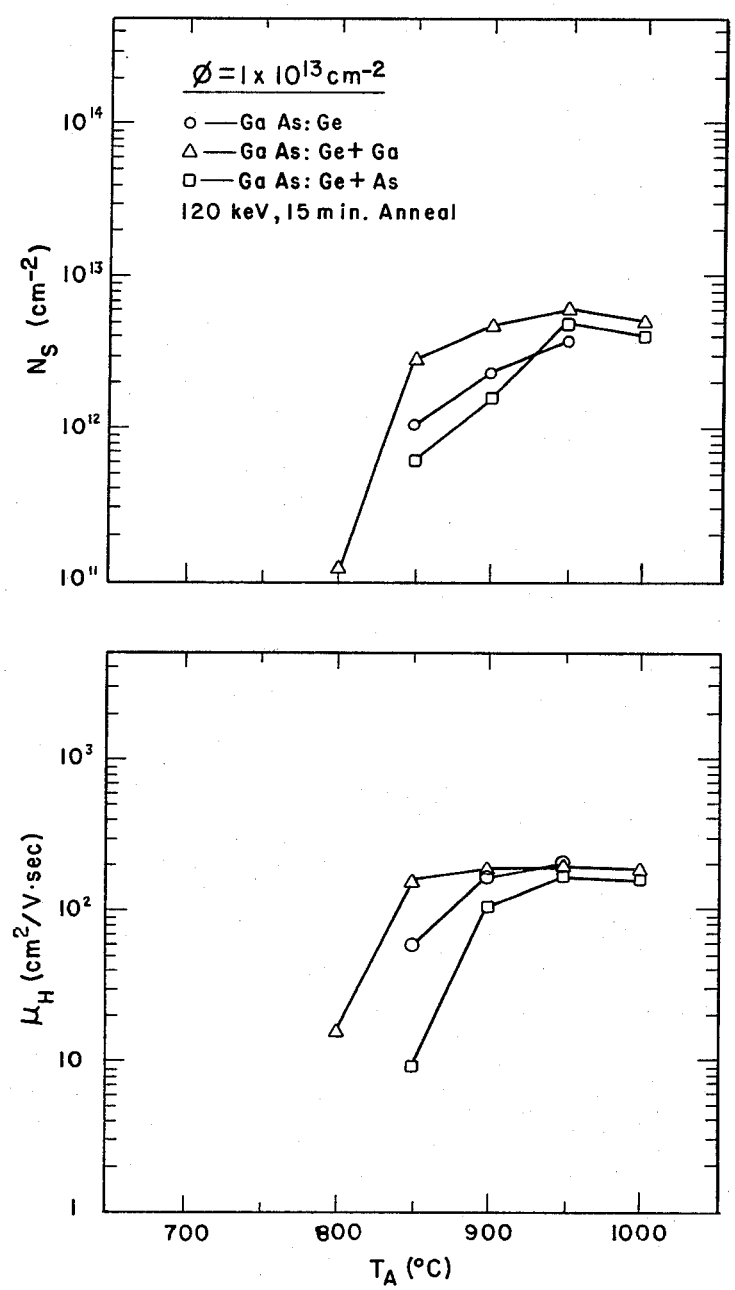
FIG. 3 is a graph showing sheet-carrier concentration $N_S$ and Hall mobility $\mu_H$ plotted as a function of annealing temperature $T_A$ for the 120 keV Ge single implant, (Ge+Ga) and (Ge+As) dual implants in GaAs:Cr for an ion dose of $1 \times 10^{13}/cm^2$. In each case the implanted ion dose is the same for Ge, Ga, and As. Solid lines indicate p-type conductivity and dashed lines indicate n-type conductivity.
Figure 4:
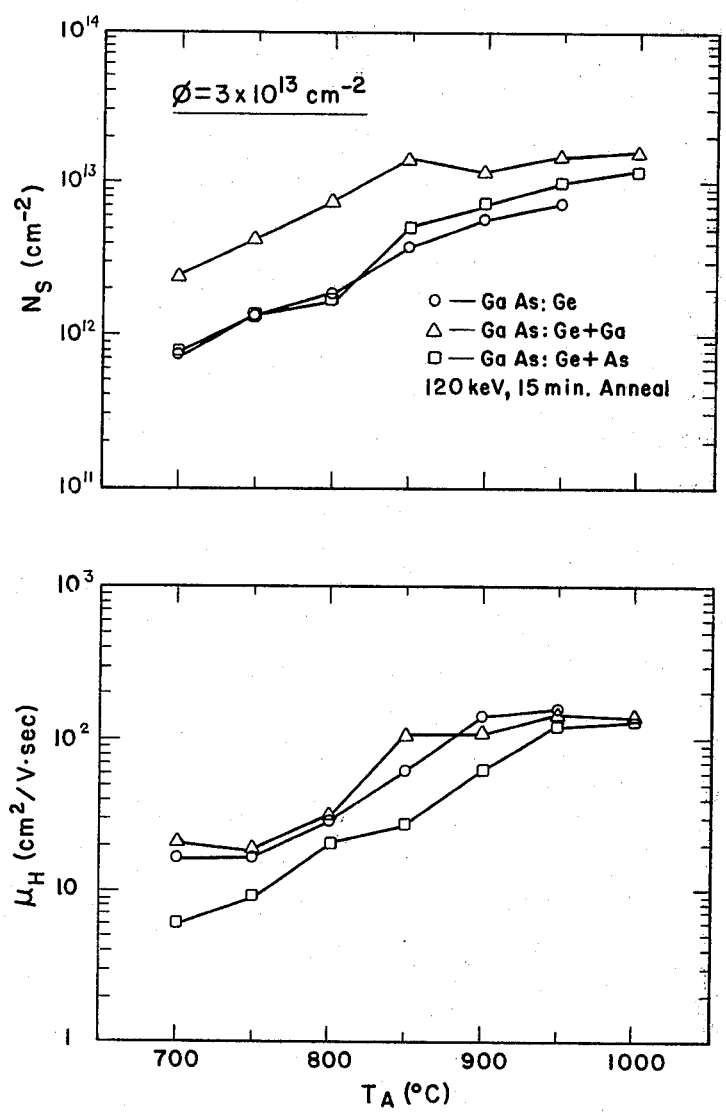
FIG. 4 is a graph showing $N_S$ and $\mu_H$ vs. $T_A$ for a $3 \times 10^{13}/cm^2$ dose of single Ge, dual (Ge+Ga) and (Ge+As) implants in GaAs:Cr.
Figure 5:
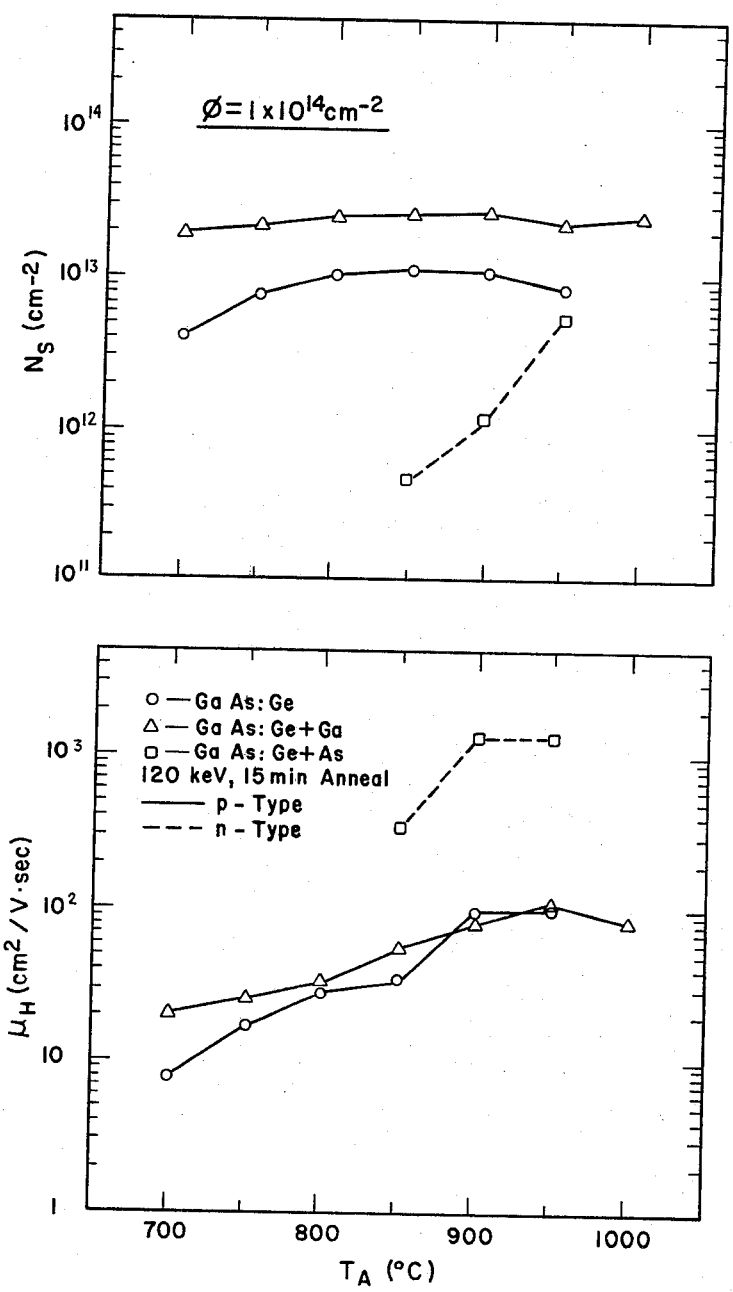
FIG. 5 is a graph showing $N_S$ and $\mu_H$ vs. $T_A$ for a $1 \times 10^{14}/cm^2$ dose of single Ge, dual (Ge+Ga) and (Ge+As) implants in GaAs:Cr.

The addition of Ga by dual implantation of Ga and Ge into GaAs is expected to favor As site occupancy by the Ge ions and an enhancement of p-type activity as shown in FIG. 1, while the addition of As would encourage Ga site occupancy and result in enhancement of n-type activity as shown in FIG. 2. In both cases the dual implantation helps to maintain the stoichiometry of the lattice. Dose or fluence as used herein refers to the Ge ion dose.

The subject matter disclosed herein has also been published in the Journal of Applied Physics, Nov. 1980, incorporated by reference. The following describes the experimental evidence of the dose and annealing conditions, and the results obtained.

The dual implantations were carried out at an energy of 120 keV with doses ranging from $5\times10^{12}$ to $3\times10^{15}/cm^2$ at room temperature into semi-insulating Cr-doped GaAs. In the case of the dual implantations, Ga or As ions were implanted after the Ge implants. In each case, equal doses of dual implants were used. The incident ion beam from a hot cathode source was directed 7° off the <100> axis to minimize ion channelling effects.

After implantation, the samples were carefully cleaned and then encapsulated with ~1000 Å layer of oxygen-free $Si_3N_4$ in a pyrolytic reactor which provided rapid heating and fast deposition. The $Si_3N_4$ deposition time was 35 sec. at 700° C. and the samples were brought to 700° C. within 9 sec. The samples were then annealed in flowing hydrogen gas for 15 min. at temperatures ranging from 700° to 1000° C. During annealing, the samples rested cap-side down on bare GaAs substrates in order to improve the performance of the caps. In this way, the caps held very successfully at temperatures as high as 1000° C. No sign of surface degradation could be observed by visual inspection.

The encapsulant was then stripped in 48% hydrofluoric acid, and indium electrical contacts were made on the four corners of the square shaped (typically 0.5×0.5 cm.) implanted surface using an ultrasonic soldering ion. The contacts were then heated at 300° C. for 3 minutes in flowing argon gas to produce ohmic behavior. It should be pointed out that contacts made on the (Ge+Ga) dual implants usually showed good ohmic behavior even without ohmic anneal.

Hall-effect/sheet-resistivity measurements were made using the standard van der Pauw technique and an apparatus which is suitable for high resistivity measurements. The sheet resistivity $\rho_s$ and sheet Hall-coefficient $R_{HS}$ were calculated from the relations $N_S = r/eR_{HS}$ and $\mu_H = R_{HS}/\rho_s$, where r is the Hall-to drift mobility ratio, customarily taken to be unity.

Depth profiles of carrier concentration and mobility were made through the combined use of the acid layer removal technique and Hall measurements. Successive thin layers of the implanted section were removed using a diluted solution of $H_2SO_4$: 30% $H_2O_2$:$H_2O$ in a 1:1:50 ratio by volume at 0° C. A typical etching rate was 200 Å/min, as determined by a Sloan Dektak Surface Profiler.

Similar GaAs control samples, implanted with the same dose of Ga or As alone, were also prepared by the same procedures, and annealed at various temperatures. The test samples did not show appreciable electrical activity, and in most cases no Hall effect could be observed.

Results and Discussion

A. (Ge+Ga) and (Ge+As) Dual Implants

The results of electrical measurements made on semi-insulating Cr-doped GaAs implanted with (Ge+Ga) and (Ge+As) to ion doses ranging from $1\times10^{13}$ to $3\times10^{15}/cm^2$ and annealed at various temperatures, together with the comparable variation for the single implanted Ge, are shown in FIGS. 3–8.

For doses of $1\times10^{13}/cm^2$ (FIG. 3) and $3\times10^{13}/cm^2$ (FIG. 4), p-type conductivity has been observed for both single and dual implants at all anneal temperatures. The annealing behavior of the sheet-carrier concentration indicates that electrical activity increases monotonically with annealing temperature, though for a dose of $1\times10^{13}/cm^2$ a slight decrease in the electrical activation has been observed between 950° and 1000° C. anneal. For the (Ge+Ga) implants, an enhancement of p-type activity is seen at all anneal temperatures. At the 950° C. anneal and $1\times10^{13}/cm^2$ dose, where the single Ge implant has its highest measured activation of 38%, the (Ge+Ga) implants yield a maximum efficiency of 61%.

The (Ge+As) implants show, on the other hand, a decrease in p-type activation for the $1\times10^{13}/cm^2$ dose annealed at 850° and 900° C. as expected. In all other cases, however, the activation after dual implantation is comparable to or even higher than that due to the Ge single implantation. This result is somewhat surprising since dual implants of (Ge+As) are expected to result in a reduction of p-type activity. The reason for this result cannot be adequately explained at present.

The annealing behavior of the Hall mobility indicates that the mobility increases with annealing temperature due to damage annealing to values in the range of 100–200 $cm^2$/V-sec as expected. At the lower anneal temperatures, mobilities of the (Ge+Ga) dual implants are somewhat higher, but at the highest annealing temperatures they are comparable to the mobilities of the Ge single-implanted samples.

For an ion dose of $1\times10^{14}/cm^2$ (FIG. 5), the effect of dual implantation is very dramatic. The p-type activity of the Ge single implant is enhanced in the (Ge+Ga) dual implants by a factor of 5 at 700° C., with somewhat improved mobility. At 900° C. the (Ge+Ga) dual implants give an activation efficiency of 27% and mobility of 83 $cm^2$/V-sec, while the activation efficiency and mobility of the Ge single implant are 11% and 96 $cm^2$/V-sec, respectively. At this dose, the conductivity of the (Ge+As) implants converts to n-type, and a sharp drop in activation efficiency occurs due to high electrical self-compensation. The mobility increases with annealing temperatures toward values representative of n-type mobilities.

Figure 6:
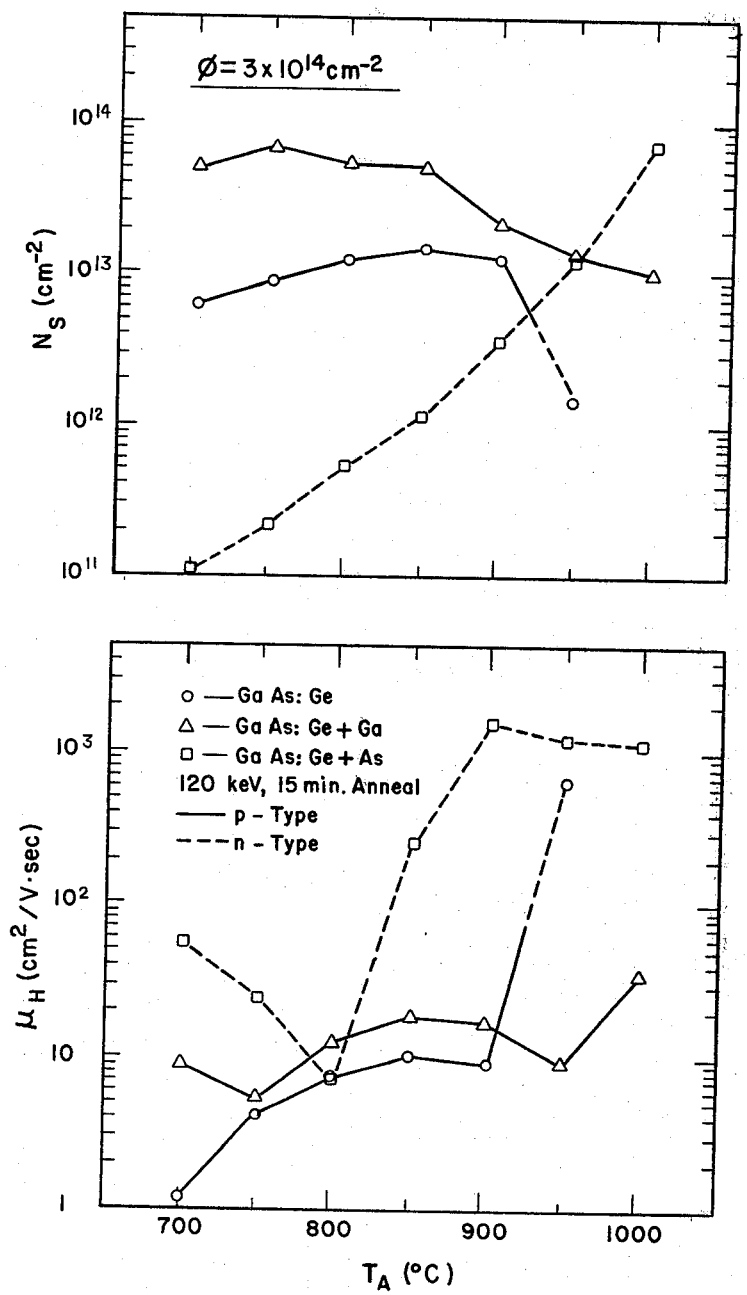
FIG. 6 is a graph showing $N_S$ and $\mu_H$ vs. $T_A$ for a $3 \times 10^{14}/cm^2$ dose of single Ge, dual (Ge+Ga) and (Ge+As) implants in GaAs:Cr.
Figure 7:
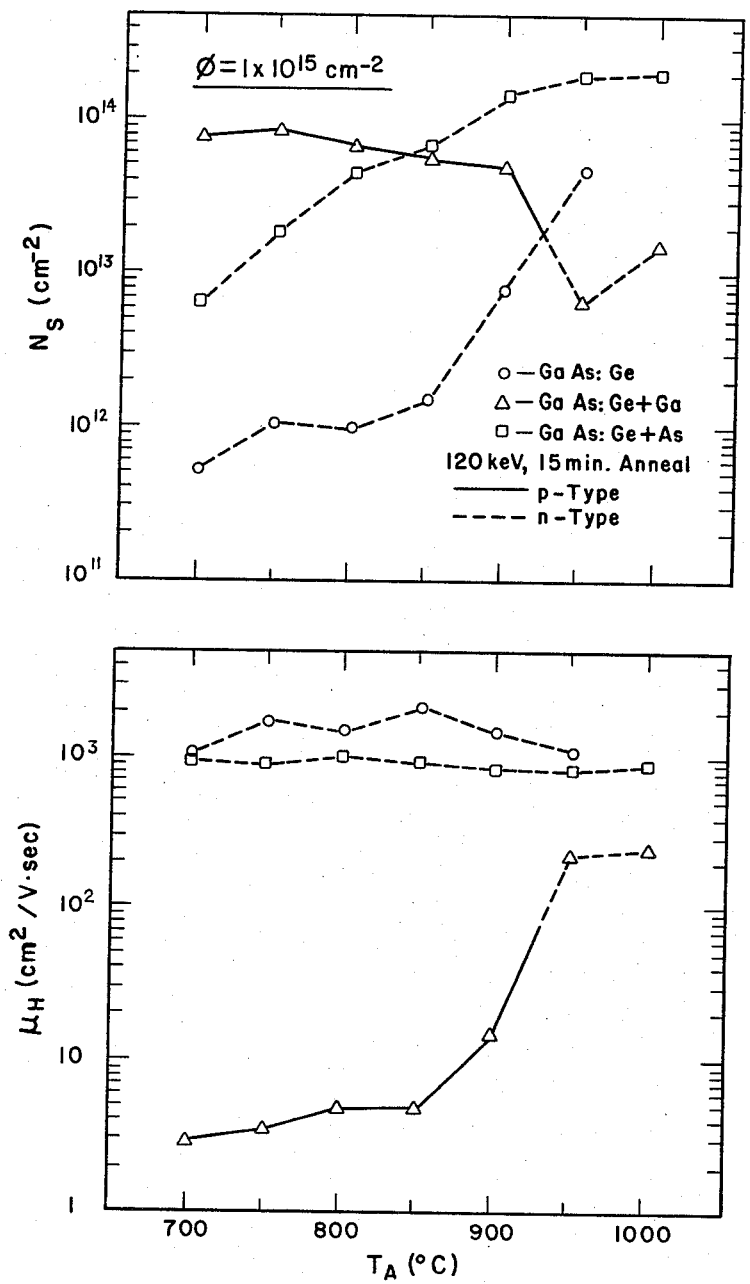
FIG. 7 is a graph showing $N_S$ and $\mu_H$ vs. $T_A$ for a $1\times10^{15}/cm^2$ dose of single Ge, dual (Ge+Ga) and (Ge+As) implants in GaAs:Cr.
Figure 8:
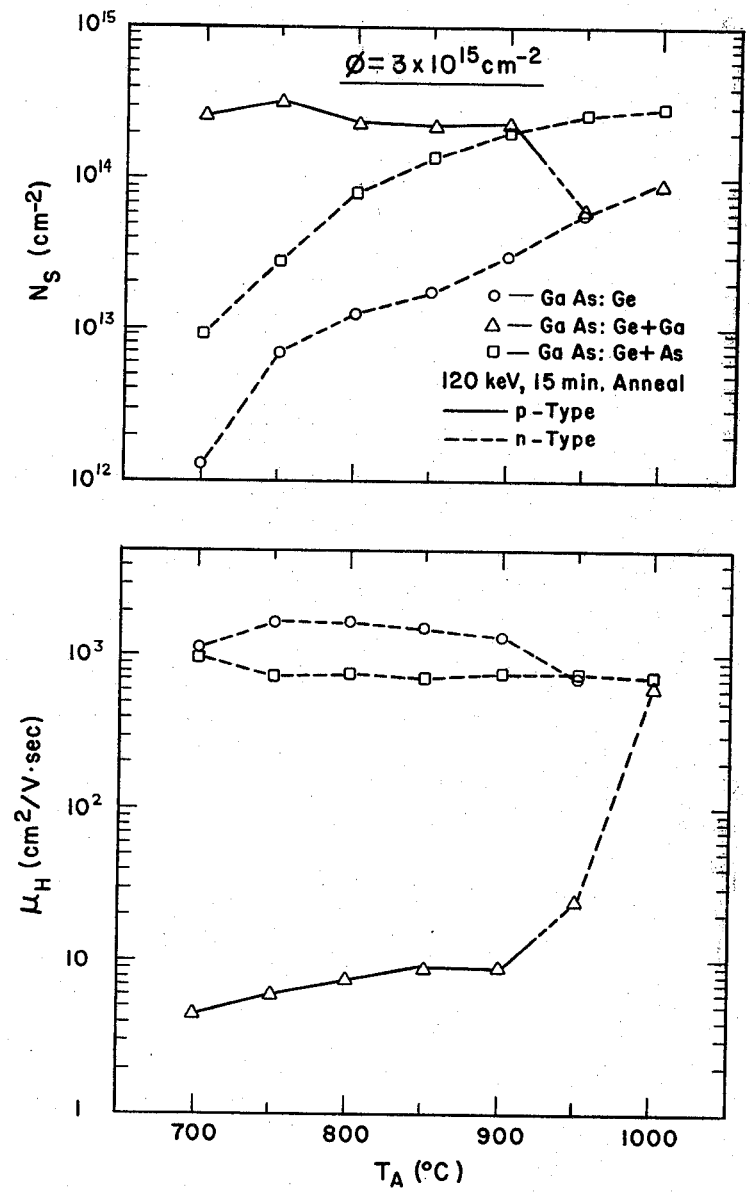
FIG. 8 is a graph showing $N_S$ and $\mu_H$ vs. $T_A$ for a $3\times10^{15}/cm^2$ dose of single Ge, dual (Ge+Ga) and (Ge+As) implants in GaAs:Cr.

FIG. 6 shows the variation of surface carrier concentration and mobility as a function of the annealing temperature for the $3\times10^{14}/cm^2$ dose. At this dose, the p-type activity (solid lines) of the Ge single implant, which persists up to 900° C., is enhanced significantly by the (Ge+Ga) dual implants. At 700°–750° C., the greatest enhancement of p-type activity by a factor of 8 was obtained over that of the Ge single implant. It is interesting to note that the conversion of p- to n-type activity of the Ge single implant above 900° C. is inhibited by the (Ge+Ga). Up to 900° C., the dual implantation shows some improvement of p-type mobility over the single implantation, although mobilities are very low in this region due to self-compensation.

For the (Ge+As) dual implants, n-type conductivity (dashed lines) has been observed at all annealing temperatures. The activation efficiency also increases rapidly with annealing temperature up to 24% at 1,000° C. The mobility of n-type samples remains low at annealing temperatures of 850° C. or below, increases with $T_A$ to 900° C., and then decreases slightly with annealing temperature. The low value of mobility below 850° C. for this dose may be due to high electrical self-compensation under conditions which promote type conversion.

Figure 9:
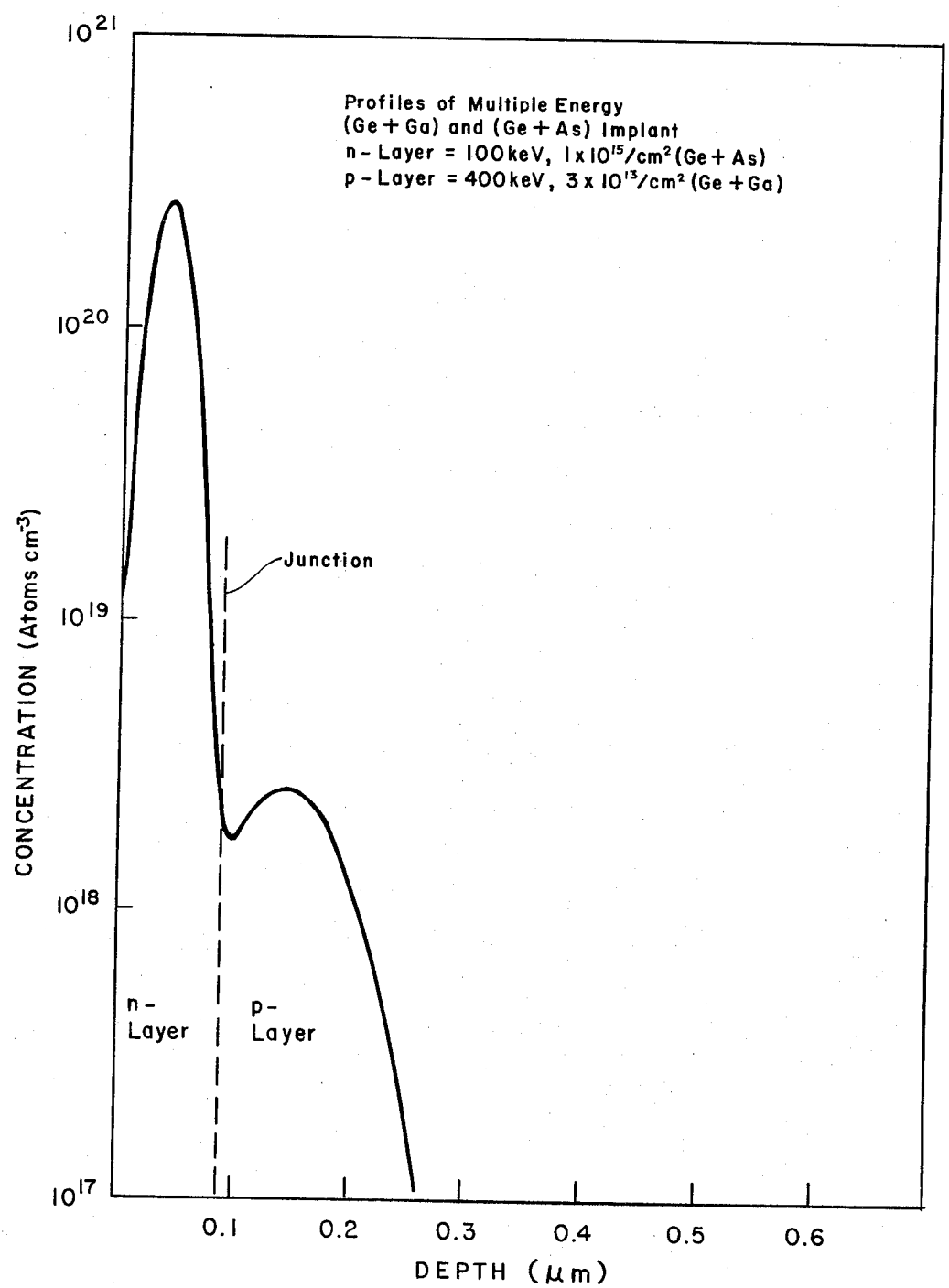
FIG. 9 is a graph showing atomic distributions of multiple energy implants of (Ge+Ga) and (Ge+As) in GaAs:Cr. An n-layer is formed by the implantation of (Ge+As) at an energy of 100 keV with a dose of $1\times10^{15}/cm^2$. A p-type layer is formed by the implantation of (Ge+Ga) at an energy of 400 keV with a dose of $1\times10^{13}/cm^2$.

For the two highest doses of $1\times10^{15}$ and $3\times10^{15}/cm^2$ (FIGS. 7 & 8), the (Ge+Ga) dual implants yield p-type activity for $T_A$ up to 900° C. The n-type activity of the Ge single implant is inhibited by the addition of Ga. After high temperature annealing at 900° C. or above, the p-type conductivity of the dual implants becomes n-type. The (Ge+As) dual implants in this dose range show n-type activation which is greatly enhanced over that of the Ge single implant at all annealing temperatures. In most cases, the activation is increased by about one order of magnitude and by as much as 45 times for a $1\times10^{15}/cm^2$ dose and 850° C. anneal. However, mobilities are generally reduced by a factor of 2 at these dose levels. At 950° C., for the $1\times10^{15}/cm^2$ dose, an activation efficiency of 19.5% and mobility of 843 $cm^2/V$-sec were obtained for the (Ge+As) dual implants compared with an activation efficiency of 4.7% and mobility of 1109 $cm^2/V$-sec for the Ge single implant. B. p-n Junction Formation By appropriate choice of implant energy, ion dose and annealing temperature, formation of p-n junction is envisioned. FIG. 9 illustrates the p-n junction layers that could be formed by the dual implantation. For example, a p-layer can be obtained by implanting the (Ge+Ga) implants at an energy of 400 keV with a dose of $3\times10^{13}/cm^2$ at room temperature into semi-insulating Cr-doped GaAs and by annealing at 900° C. for 15 min with a $Si_3N_4$ cap in flowing hydrogen gas. An n-layer is formed by the successive implantation of the (Ge+As) implants at an energy of 100 keV with a dose of $1\times10^{15}/cm^2$ and by annealing at 900° C. for 15 min. Or annealing at 850° or 900° C. can be performed after multiple energy implantations.

FIGS. 10–12 are symbolic diagrams showing steps in making a p-n junction using dual implantation into GaAs.

FIG. 10 shows preparation of the surface of the chromium-doped semiconducting GaAs. The steps are (a) lap and polish and (b) a chemical etch.

FIG. 11 shows the dual implant at 400 keV of positive ions of Ge and Ga at a dose of $3\times10^{13}/cm^2$, followed by annealing at a temperature of 950° C. or less.

FIG. 12 shows the dual implant at 100 keV of positive ions of Ge and As at a dose of $1\times10^{15}/cm^2$, followed by annealing.

The result is a p-layer below an n-layer at the surface.

CONCLUSION

Table I summarizes the results of single Ge and dual implantation of (Ge+Ga) and (Ge+As) into semi-insulating, Cr-doped GaAs.

Single implants of Ge into GaAs have been shown to produce p-type or n-type conducting layers depending upon ion dose and annealing temperature. In samples having low doses ($\leq 1\times10^{14}/cm^2$), the implanted Ge ions occupy As sites preferentially, producing p-type conductivity at all annealing temperatures from 700° to 950° C. A maximum efficiency of 38% was obtained at a dose of $1\times10^{13}/cm^2$ and an annealing temperature of 950° C. For high doses ($\geq 1\times10^{15}/cm^2$), more Ge ions occupy Ga sites than As sites, producing n-type activity at all annealing temperatures, with maximum activation efficiency of only 5%. The transition from p- to n-type conductivity occurs at the intermediate dose of $3\times10^{14}/cm^2$ and an annealing temperature between 900° and 950° C.

Dual implantation of Ge and Ga into GaAs indicates that the amphoteric electrical behavior of Ge is significantly changed from that of Ge single implantation. The dual implants have produced p-type conductivity for all doses ($\leq 3\times10^{15}/cm^2$) for an annealing temperature of up to 900° C. The p-type electrical activity of Ge in the dual implantation has been found to be improved significantly over that of the single implantation for all doses of $\leq 3\times10^{14}/cm^2$, while the original n-type of the Ge single implant has been found to change to p-type for doses of $\geq 1\times10^{15}/cm^2$, except at anneal temperatures higher than 900° C.

Dual implantation of Ge and As into GaAs has produced a significant enhancement of n-type activity for ion doses of $\geq 1\times10^{15}/cm^2$, a conductivity type conversion for intermediate doses, and little effect upon p-type activity for ion doses of $\leq 3\times10^{13}/cm^2$. In most cases, the electrical activation continues to increase with annealing temperature up to 1,000° C. The maximum electrical activation efficiency obtained for these dual implants was 50% at an ion dose of $1\times10^{13}/cm^2$ for the p-type samples and 24% at an ion dose of $3\times10^{14}/cm^2$ for the n-type samples.

In conclusion, we have found that the electrical activity of the amphoteric dopant Ge in GaAs can be modified in a controlled manner by dual implantation of (Ge+Ga) and (Ge+As). Although the possibility exists that defects such as As and Ga vacancies, or their complexes, may influence electrical activity, it is evident that the results obtained are due mainly to the amphoteric nature of the implanted Ge ions.

Thus, while preferred constructional features of the invention are embodied in the structure illustrated herein, it is to be understood that changes and variations may be made by the skilled in the art without departing from the spirit and scope of my invention.

TABLE I

| Conductivity | Implantation GaAs:Ge | GaAs: (Ge + Ga) (p-type activity enhanced) | GaAs: (Ge + As) (n-type activity enhanced) |
|---|---|---|---|
| P-TYPE | $\phi \sim 1 \times 10^{14}$/cm or below $T_A$ - up to 950° C. | $\phi$ - ALL $T_A$ - up to 900° C. | $\phi \sim 3 \times 10^{13}$/cm or below $T_A$ - ALL |
| TYPE CONVERSION | $\phi \sim 3 \times 10^{14}$/cm $T_A$ - 900–950° C. | $\phi \gtreqqless 1 \times 10^{15}$/cm $T_A \sim$ 900–950° C. | $\phi \sim 1 \times 10^{14}$/cm $T_A$ - ALL |
| N-TYPE | $\phi \sim 1 \times 10^{15}$/cm or above $T_A$ - ALL | $\phi \sim 1 \times 10^{15}$/cm or above $T_A \sim$ 950° C. or above | $\phi \sim 1 \times 10^{14}$/cm or above $T_A$ - ALL |

We claim:

1. A method of forming a p-n junction in semiconducting GaAs device comprising:
   a. dual ion implantation of Ge and Ga to provide a layer having p-type conductivity activity;
   b. forming an n-layer by dual ion implantation of Ge and As at a dose in the range from about $1 \times 10^{14}$/cm² extending to at least $3 \times 10^{15}$/cm² at an energy level substantially less than that used to form the p-layer; and
   c. annealing said device.

2. The method of claim 1, wherein the annealing temperature is approximately 900° C. or less.

3. The method of claim 1, wherein said GaAs is Cr doped;
   wherein preceding step (a) the surface is prepared by a lap and polish followed by a chemical etch;
   wherein step (a) comprises an ion dose at approximately $3 \times 10^{13}$/cm² at an energy level of approximately 400 keV; and
   wherein step (b) comprises an ion dose of approximately $1 \times 10^{15}$/cm² at an energy level of approximately 100 keV.

4. The method of claim 3, wherein between steps (b) and (c) the device is cleaned and then encapsulated with approximately 1000 angstroms of oxygen-free Si₃N₄ in a pyrolytic reactor which provides rapid heating and fast deposition, the Si₃N₄ deposition time being approximately 35 seconds at 700° C. with the device brought to 700° C. within 9 seconds;
   wherein the annealing step (c) is done in flowing hydrogen at a temperature of 700° C. to 1,000° C., and during the annealing step the device rests cap-side down on a bare GaAs substrate;
   wherein after the annealing step the encapsulant is stripped in 48% hydrofluoric acid; and
   wherein after the annealing step an indium electrical contact is formed on the device using an ultrasonic soldering iron, following which the contact is heated at 300° C. for three minutes in flowing argon gas to produce ohmic behavior.

5. A method of forming a layer in a semi-insulating GaAs device comprising:
   a. dual ion implantation of Ge and Ga with any dose from at least as low as $1 \times 10^{13}$/cm² up to at least $3 \times 10^{15}$/cm²; and
   b. annealing, wherein an annealing temperature up to 900° C. produces p-type conductivity activity in said layer.

6. The method of claim 5, wherein a conductivity type conversion occurs for ion doses equal or greater than $1 \times 10^{15}$/cm² followed by annealing at a temperature of 900° C. to 950° C.; and
   wherein n-type activity is produced for ion doses of approximately $1 \times 10^{15}$/cm² or above followed by annealing at a temperature of approximately 950° C. or above.

7. A method of forming a layer in a semi-insulating GaAs device comprising:
   a. dual ion implantation of Ge and As at a dose in the range of approximately $1 \times 10^{14}$/cm² up to at least $3 \times 10^{15}$/cm² to produce n-type conductivity in said layer; and
   b. annealing at a temperature in the range of at least 700° to 1,000° C.;
   wherein a conductivity type conversion occurs for ion doses of approximately $1 \times 10^{14}$/cm²; and
   wherein p-type conductivity activity results from an ion dose of approximately $3 \times 10^{13}$/cm² or below.

8. A method of forming a layer in a semi-insulating GaAs device comprising:
   a. dual ion implantation of Ge and As with a dose up to $3 \times 10^{13}$/cm², and
   b. annealing, wherein any annealing temperature in the range of 700° to 1,000° C. produces p-type conductivity activity in said layer.

9. The method of claim 5, 6, 7 or 8, wherein between the ion implanting and annealing steps the device is cleaned and then encapsulated with approximately 1000 angstroms of oxygen-free Si₃N₄ in a pyrolytic reactor which provides rapid heating and fast deposition, the Si₃N₄ deposition time being approximately 35 seconds at 700° C. with the device brought to 700° C. within 9 seconds;
   wherein the annealing step is done in flowing hydrogen at said temperature with the device resting cap-side down on a bare GaAs substrate;
   wherein after the annealing step the encapsulant is stripped in 48% hydrofluoric acid.

10. The method of claim 9, wherein after the annealing step an indium electrical contact is formed on the device using an ultrasonic soldering iron, following which the contact is heated at 300° C. for three minutes in flowing argon gas to produce ohmic behavior.